United States Patent
Trautmann et al.

(10) Patent No.: US 9,972,690 B2
(45) Date of Patent: May 15, 2018

(54) METHOD FOR PRODUCING A DIELECTRIC FIELD PLATE IN A SUBSTRATE TRENCH, A CORRESPONDING SUBSTRATE, AND A POWER TRANSISTOR

(71) Applicant: Robert Bosch GmbH, Stuttgart (DE)

(72) Inventors: Achim Trautmann, Leonberg (DE); Christian Tobias Banzhaf, Laichingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days. days.

(21) Appl. No.: 15/300,524

(22) PCT Filed: Mar. 9, 2015

(86) PCT No.: PCT/EP2015/054821
§ 371 (c)(1),
(2) Date: Sep. 29, 2016

(87) PCT Pub. No.: WO2015/150023
PCT Pub. Date: Oct. 8, 2015

(65) Prior Publication Data
US 2017/0117369 A1 Apr. 27, 2017

(30) Foreign Application Priority Data
Apr. 3, 2014 (DE) .................... 10 2014 206 361

(51) Int. Cl.
*H01L 29/40* (2006.01)
*H01L 29/66* (2006.01)
(Continued)

(52) U.S. Cl.
CPC ........ *H01L 29/407* (2013.01); *H01L 29/1608* (2013.01); *H01L 29/41766* (2013.01);
(Continued)

(58) Field of Classification Search
CPC combination set(s) only.
See application file for complete search history.

(56) References Cited

U.S. PATENT DOCUMENTS

| 6,262,453 B1 | 7/2001 | Hshieh |
| 2011/0133272 A1 | 6/2011 | Mauder et al. |

(Continued)

FOREIGN PATENT DOCUMENTS

| EP | 2 339 636 A1 | 6/2011 |
| JP | 2009-026809 A | 2/2009 |

(Continued)

OTHER PUBLICATIONS

International Search Report corresponding to PCT Application No. PCT/EP2015/054821, dated May 15, 2015 (German and English language document) (7 pages).

*Primary Examiner* — Mamadou Diallo
(74) *Attorney, Agent, or Firm* — Maginot, Moore & Beck LLP

(57) ABSTRACT

A substrate includes a trench with walls and a base. The substrate also includes a dielectric field plate. The dielectric field plate consists of at least one first dielectric layer, which only adjoins lower sections of the walls of the trench and the base of the trench. Parasitic capacitances can be reduced when using this substrate for power transistors.

10 Claims, 7 Drawing Sheets

(51) Int. Cl.
*H01L 29/16* (2006.01)
*H01L 29/417* (2006.01)
*H01L 29/423* (2006.01)
*H01L 29/78* (2006.01)

(52) U.S. Cl.
CPC .... *H01L 29/4236* (2013.01); *H01L 29/66068* (2013.01); *H01L 29/66734* (2013.01); *H01L 29/7813* (2013.01)

(56) References Cited

U.S. PATENT DOCUMENTS

| | | |
|---|---|---|
| 2012/0068248 A1 | 3/2012 | Kawaguchi |
| 2012/0168859 A1* | 7/2012 | Jin ........................ H01L 29/407 257/330 |
| 2013/0248992 A1* | 9/2013 | Padmanabhan ... H01L 29/41766 257/331 |
| 2015/0236127 A1* | 8/2015 | Miyahara .......... H01L 29/66734 257/77 |
| 2016/0104794 A1* | 4/2016 | Takeuchi ............ H01L 29/1608 257/77 |

FOREIGN PATENT DOCUMENTS

| | | |
|---|---|---|
| JP | 2011-216651 A | 10/2011 |
| JP | 2012-64849 A | 3/2012 |
| WO | 2005/088725 A2 | 9/2005 |

* cited by examiner

METHOD FOR PRODUCING A DIELECTRIC FIELD PLATE IN A SUBSTRATE TRENCH, A CORRESPONDING SUBSTRATE, AND A POWER TRANSISTOR

This application is a 35 U.S.C. § 371 National Stage Application of PCT/EP2015/054821, filed on Mar. 9, 2015, which claims the benefit of priority to Serial No. DE 10 2014 206 361.2, filed on Apr. 3, 2014 in Germany, the disclosures of which are incorporated herein by reference in their entireties.

The present disclosure relates to a method for producing a dielectric field plate in a trench of a substrate, a corresponding substrate, and a power transistor with such a substrate.

BACKGROUND

Silicon-based substrates which, for example, include a silicon carbide layer, are increasingly being used in standard components. For example, power semiconductors, which block voltages of up to more than 1.2 kV, are implemented using such substrates, as metal-oxide semiconductor transistors, for example, as trench metal-oxide semiconductor field-effect transistors (trench MOSFETs) or as trench bipolar transistors with an insulated gate electrode (trench IGBTs). Such power semiconductors are used, for example, in electric vehicle applications, i.e., motor vehicles with batteries, for example, lithium-ion cell-based batteries, or in photovoltaic systems. Micromechanical systems may also be implemented with such substrates. For micromechanical systems, the substrate may further include a silicon dioxide layer, a silicon nitride layer, or a silicon layer on which the silicon carbide layer is deposited.

To implement a trench MOSFET, for example, a substrate (monocrystalline n-doped 4H—SiC substrate) is used, whose silicon carbide layer has a hexagonal crystal structure and is n-doped. An n-doped silicon carbide buffer layer is arranged between the silicon carbide layer and a weakly n-doped silicon carbide drift zone (n-drift zone).

A (moderately) p-doped silicon carbide layer ($p^-$ layer) is arranged on the n-doped 4H—SiC substrate, which may be epitaxially grown or implanted. A more highly n-doped silicon carbide layer ($n^+$ source), which may be epitaxially grown or implanted, is arranged on a portion of the $p^-$ layer, and acts as a source terminal. In this case, a rear side of the 4H—SiC substrate acts as a drain terminal. Next to the $n^+$ source, a $p^+$ terminal ($p^+$ plug) is implanted into the $p^-$ layer, so that an upper side of the $p^+$ plug interfaces with the upper side of the $n^+$ source, and the $p^+$ plug may be used for defining the channel potential. The $p^-$ layer and the $n^+$ source are each structured via a recess which is arranged above a structure (trench) via which the n-drift zone is structured.

After the structuring, the trench may be coated with a gate oxide. Alternatively or additionally, a highly doped implantation may take place in the floor of the trench. A polysilicon gate is then deposited into the trench. Thus, a vertical channel region is created in the $p^-$ layer. This allows a higher packing density of parallel-connected transistors than with transistors having a lateral channel region.

SUMMARY

According to the present disclosure, a method as set forth in the following description for producing a dielectric field plate in a trench of a substrate is provided. The method is characterized in that it has the following steps: (a) depositing a dielectric structure onto the walls and floor of the trench and onto surface sections of the substrate which are adjacent to the trench, wherein the dielectric material or the dielectric materials which are included in the dielectric structure differ from the material or the materials which form the walls, the floor, and the surface sections of the substrate; (b) depositing a stop material which fills the trench, covers the dielectric structure, and is different from the dielectric material or the dielectric materials, wherein the stop material is also different from the material or the materials of the substrate; (c) selective etching back of a portion of the stop material with a first etching means in such a way that a portion of the dielectric structure which covers the surface sections of the substrate and the walls of the trench is exposed; (d) selective etching back of the dielectric structure with a second etching means which is different from the first etching means in such a way that the surface of the substrate and upper sections of the walls are exposed, wherein a remainder of the dielectric structure, which covers lower sections of the wall and the floor, remains; and (e) selective etching back of a remainder of the stop material with a third etching means which is different from the second etching means.

With the aid of the method according to the present disclosure, it is possible for the first time to produce a dielectric field plate in a trench of a substrate. In this case, the dielectric field plate includes at least one dielectric layer, which, however, covers only the floor of the trench and a portion of the walls of the trench originating at the floor of the trench. The height of the partial section of the trench wall covered by the dielectric layer is varied as a function of the specific application, for example, as a function of the desired design of the power transistor. However, in this case, the dielectric layer never covers the entire wall, so that a partial region of the wall extending from the surface up to this dielectric layer always remains exposed.

In step (a), at least one dielectric layer or a stack of dielectric layers is deposited on the substrate. In this case, the dielectric layer covers at least the walls and floor of the trench, preferably also a surface of the substrate. Step (b) provides that at least the remaining volume of the trench is completely filled with a material acting as a temporary resist; preferably, the covered surface of the substrate is also covered by the material acting as a temporary resist. This material, which is presently referred to as stop material, differs from the material of the at least one dielectric layer. The choice of the specific stop material depends on selectively acting etching means in the context of steps (c) to (e) being available. On the one hand, for the stop material, there must be a (first) etching means which is used first and does not simultaneously etch away the dielectric material which covers at least the walls and the floor of the trench. On the other hand, this specification also applies reciprocally to the etching back of the dielectric material. The selected dielectric material must be largely inert with respect to the first etching means, i.e., it must be only slowly etchable via the first etching means. Simultaneously, for the dielectric material, there must be an additional (other, second) etching means which is subsequently used and does not simultaneously etch away the material (or the materials) of the substrate and also does not etch away the stop material. In other words, the initially used first etching means is selectively etching for the stop material and does not etch the dielectric layer, and the subsequently used second etching means is selectively etching for the dielectric material and does not etch at least the material (or the materials) of the substrate. Finally, for the stop material, there must be yet another (third) etching means, which etches neither the dielectric material nor the material (or the materials) of the substrate, so that the remainder of the stop material may be removed. The first etching means and the third etching means may be identical or different. It is also possible that the second etching means also does not etch the stop material. Here, "selective" means that the etching rates of the stop material, or of the dielectric layer for the respective etching means which is selectively etching, differ by at least the factor 2, preferably 5, particularly preferably 10, in particular, the factor 50, from etching rates for the particular non-etched material or materials. Particularly preferably, the etching rate of the material (or the materials) which are not to be etched, but which are accessible, equals zero. The etching rate describes the etching erosion per unit of time and is, for example, specified in nanometers per minute or angstroms per second. For a plurality of materials used conventionally in semiconductor technology, in particular dielectrics, semiconductors, and metals, etching methods are known and have been developed, which those skilled in the art will take into account when establishing the combination of materials for the first dielectric layer and the stop material. With respect to the selection, those skilled in the art may proceed in such a way that a presently used dielectric material is initially selected for the first dielectric layer, for which there is a proven etching method which does not etch the material or the materials which form the walls and the floor of the trench. Those skilled in the art will then select the stop material in such a way that it is at least largely inert with respect to the etching method for the dielectric material, and in addition, an etching method for this stop material exists which attacks neither the dielectric material nor the material or the materials which form the walls and the floor of the trench. Suitable etching methods (in particular, dry and wet etching methods) for dielectrics, semiconductor materials, and metals, may be extracted from many standard works; therefore, further details will not be provided here.

In one advantageous specific embodiment, the dielectric material may be selected from a material group including silicon dioxide ($SiO_2$), silicon nitride ($Si_3N_4$), aluminum oxide ($Al_2O_3$), intrinsic polysilicon carbide (SiC), and thermally oxidized polysilicon.

The material which forms the walls, the floor, and the surface sections of the substrate adjacent to the trench may be an additional dielectric material. The additional dielectric material may also be selected from the material group comprising silicon dioxide ($SiO_2$), silicon nitride ($Si_3N_4$), aluminum oxide ($Al_2O_3$), intrinsic polysilicon carbide (SiC), and thermally oxidized polysilicon.

When using the substrate for a power transistor, the additional dielectric material may advantageously constitute part of a gate dielectric.

The stop material may be selected from a material group comprising dielectrics, semiconductors, or metals.

The trench and the remainder of the dielectric structure may be U-shaped.

An additional aspect of the present disclosure includes the provision of a substrate with a trench which has walls and a floor. The substrate provided according to the present disclosure is characterized in that the substrate has a dielectric field plate made up of at least a first dielectric layer, wherein the dielectric field plate abuts only the lower sections of the walls of the trench and the floor of the trench. The substrate may be obtained in particular via the previously described method.

In one exemplary embodiment, the substrate may include a silicon carbide layer and a p-doped silicon carbide layer which is arranged directly on the silicon carbide layer, wherein the trench extends through the p-doped silicon carbide layer into the silicon carbide layer, and the dielectric field plate abuts only the lower sections of the walls of the trench which are formed by the silicon carbide layer, and the floor of the trench.

A substrate with a trench coated with a dielectric material in such a way may be used for various electronic power components. Micromechanical systems (MEMS) are another application example. Application examples for power transistors include MOS transistors, for example, trench MOSFETs or trench IGBTs. In such transistors, the at least one dielectric layer acts as a field plate. The arrangement of such a field plate counteracts in particular a concentration of field lines in the transition from the trench wall to the trench floor when using the substrate for a power transistor with a gate oxide. Therefore, high field strengths and thus electrical breakdowns through the gate oxide, or high loads on the gate oxide in the case of reverse-biasing, and thus shortening of the lifetime of the power transistor, are prevented. The field plate also enables faster switching processes and lower power dissipation during switching (switchover losses), which are also beneficial to longevity.

Finally, one aspect of the present disclosure also relates to a power transistor with the substrate provided according to the present disclosure.

Advantageous refinements of the present disclosure are specified in the following description or may be extracted from the additional description.

BRIEF DESCRIPTION OF THE DRAWINGS

Exemplary embodiments of the present disclosure are described in greater detail based on the drawings and the following description. The following are schematically depicted.

DETAILED DESCRIPTION

FIGS. 1, 2, 3, 4, and 5 show exemplary structures of a substrate before and during the production of dielectric field plates in trenches of the substrate, and thus schematically illustrate steps and semi-finished products of one exemplary embodiment of the method provided according to the present disclosure.

Figure 1:
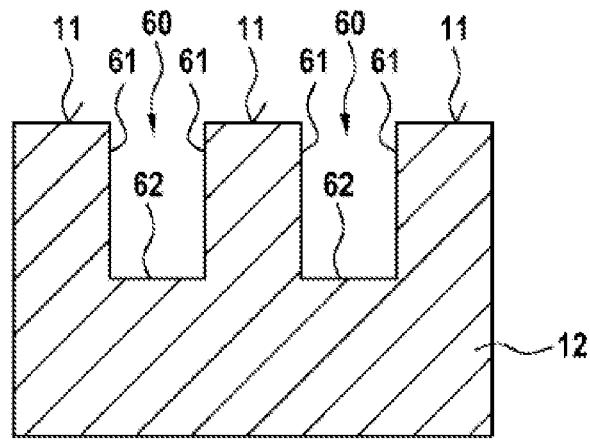
FIG. 1 shows an exemplary substrate with trenches.

FIG. 1 shows an exemplary substrate 10 made up of one or multiple materials, with two trenches 60. The trenches preferably have a "U" shape. The trenches 60 are formed with walls 61 which are essentially perpendicular to a surface 11 of the substrate 10, and a floor 62 which is essentially parallel to the surface 11 of the substrate 10.

Figure 2:
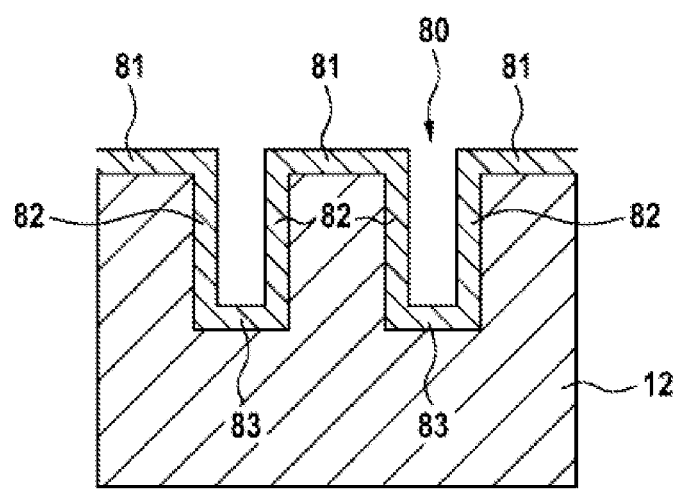
FIG. 2 shows the exemplary substrate from FIG. 1 with a dielectric layer on a surface of the substrate, walls, and floors of the trenches.

FIG. 2 shows the exemplary substrate from FIG. 1 with a dielectric structure made up of a dielectric material designed as a single dielectric layer 80. The dielectric layer 80 is applied in a conformal manner. One portion of the dielectric layer 80 is deposited on surface sections 11 of the substrate 10 which are adjacent to the trench. An additional portion 82 of the dielectric layer 80 is deposited on upper sections of the walls 61 of the trenches. A remainder 83 of the dielectric layer 80 is deposited on lower sections of the walls 61 of the trenches and on floors 62 of the trenches. Taking into consideration the material or the materials of the substrate which are accessible to etching means, the dielectric material is chosen in such a way that, with respect to at least one etching means, an etching rate of the dielectric material is greater than an etching rate of the material or the materials. The ratio of the etching rates may, for example, equal 2, 5, 10, or 100. The dielectric material is also referred to as being selectively etchable with respect to the material (or the materials) of the substrate. It demonstrates a selective etchability with respect to the material (or the materials) of the substrate. The material or the materials thus form at least the surface of the substrate and the walls and the floor of the trench. If the dielectric structure comprises different dielectric layers, all dielectric layers must be selectively etchable with respect to the material (or the materials) of the substrate.

The dielectric material may, for example, be silicon dioxide, silicon nitride, aluminum oxide, intrinsic polysilicon carbide, and thermally oxidized polysilicon.

For example, a dielectric made up of polysilicon may be etched via a wet-chemical etching method using hydrofluoric acid (HF). Of course, the etching method must not attack the materials of the substrate lying directly below the dielectric layer. Accordingly, the etching means must also be selectively etching in the sense described above with respect to these substrate materials. This is, for example, the case if these substrate regions are made of silicon carbide.

Figure 3:
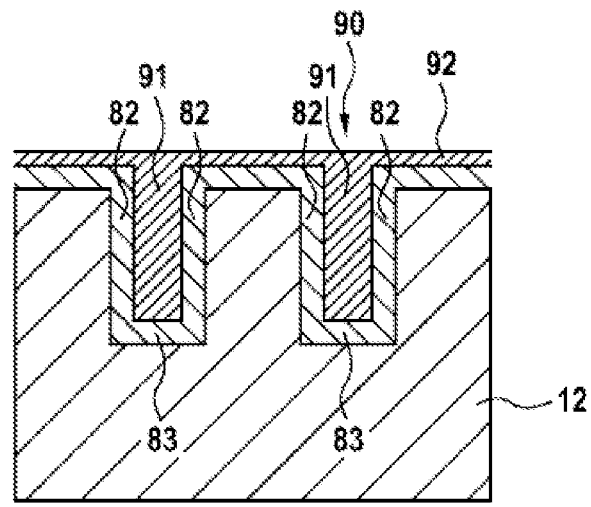
FIG. 3 shows the exemplary substrate from FIG. 2 with a stop material which is deposited onto the dielectric in such a way that the trenches are filled.

FIG. 3 shows the exemplary substrate from FIG. 2 with a stop material 90 which differs from the material (or the materials) of the substrate and the dielectric material in the sense that, taking into consideration the material (or the materials) of the substrate and the dielectric material, the stop material is chosen in such a way that, with respect to at least one other etching means, an etching rate of the stop material is greater than an etching rate of the material (or the materials) of the substrate by a first factor, and is greater than an etching rate of the dielectric material by a second factor. The first factor and the second factor may be equal or different. Example values of the first factor and the second factor are 2, 5, 10, and 100. The stop material 90 may thus be selectively etched via the at least one other etching means, which significantly etches the stop material, but which does not at all etch, or only slightly etches, the dielectric layer 80, i.e., the dielectric material, and the substrate 10. The stop material is also referred to as being selectively etchable with respect to the material (or the materials) of the substrate and with respect to the dielectric material. It has a selective etchability with respect to the material (or the materials) of the substrate and the dielectric material. If the dielectric structure comprises different dielectric layers, the stop material must be selectively etchable with respect to all these dielectric layers.

The stop material 90 is deposited onto the dielectric layer 80. A first portion 91 of the stop material 90 is deposited into the trenches 60 in such a way that they are completely filled. A second portion 92 of the stop material 90 is deposited on the portion of the dielectric layer 80 which is arranged on the surface sections 11 of the substrate 10 which are adjacent to the trench, and onto the filled trench 60. In the case of a stop material made of polysilicon, the other etching means which is selectively etching may, for example, be a mixture of ammonium fluoride ($NH_4F$) and nitric acid ($HNO_3$), which may additionally contain water.

The stop material may also be a metal, for example, tungsten. Furthermore, the stop material may be selected from the materials silicon dioxide, silicon nitride, aluminum oxide, intrinsic polysilicon, and thermally oxidized polysilicon, wherein the difference from the dielectric material in terms of the etching rate relative to at least one second etching means must be taken into account.

Figure 4:
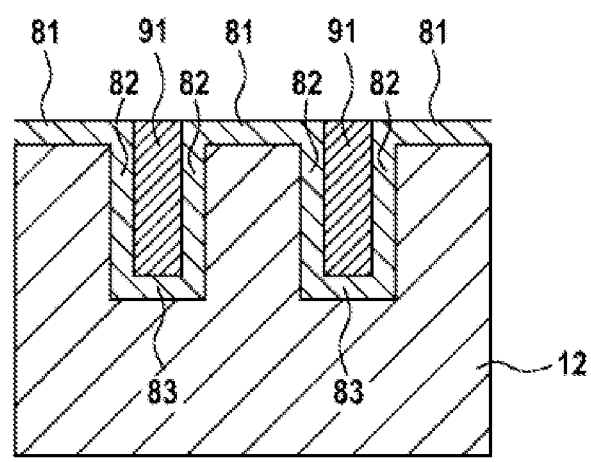
FIG. 4 shows the exemplary substrate from FIG. 3, wherein the stop material is selectively etched back to the extent that the dielectric layer on the surface of the substrate is exposed.

FIG. 4 shows the exemplary substrate from FIG. 3, wherein the second portion 92 of the stop material 90 is selectively etched back using the other etching means, which is also referred to as the first etching means due to the etching sequence, so that the portion of the dielectric layer 80 which is arranged on the surface sections 11 of the substrate 10 which are adjacent to the trench 60 is exposed. At least one upper side of the additional portion 82 of the dielectric layer 80 which is deposited on the upper sections of the walls 61 of the trenches 60 is also exposed. The portion and the additional portion of the dielectric layer 80 are now accessible to the etching means.

Figure 5:
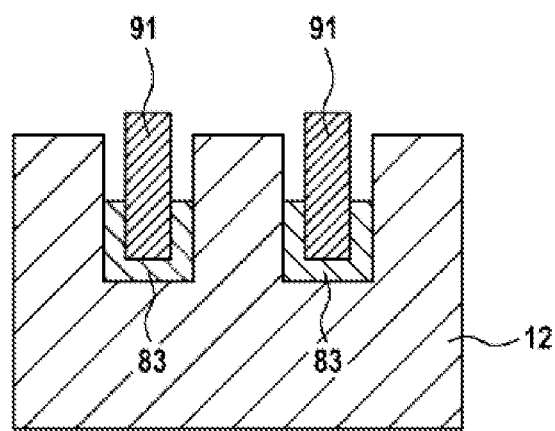
FIG. 5 shows the exemplary substrate from FIG. 4, wherein the dielectric layer is selectively etched back to the extent that upper wall sections of the trenches are exposed.

FIG. 5 shows the exemplary substrate from FIG. 4, wherein the remainder 82 and the additional portion 81 of the dielectric layer 80 are selectively etched back using the etching means, which is also referred to as the second etching means due to the etching sequence, so that the upper sections of the walls 61 of the trenches 60 are exposed. The U-shaped portion 83 in the example remains. In the depicted example, the upper half of the walls 61 of the trench 60 is exposed, while the lower half of the walls 61 of the trench 60 is still covered by the dielectric layer. In another exemplary embodiment, the upper two-thirds of the walls 61 of the trench 60 is exposed. In the case of the use of the substrate for trench power transistors, for example, the layer or the partial layer is exposed, in which a vertical channel region is created.

Figure 6:
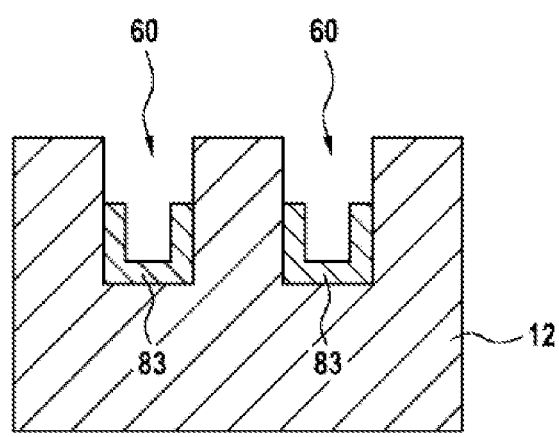
FIG. 6 shows one exemplary embodiment of the substrate provided according to the present disclosure, wherein the stop material is completely removed from the trench.

FIG. 6 shows one exemplary embodiment of the substrate provided according to the present disclosure. The exemplary substrate comprises a silicon carbide layer in which a trench 60 is formed, and a dielectric field plate 83 which is arranged on lower sections of the walls 61 of the trench on a floor 62 of the trench, so that upper sections of the walls 61 are not covered by the dielectric field plate.

The substrate may, for example, be produced by also completely, selectively etching back the first portion 91 of the stop material 90 of the exemplary substrate from FIG. 5 using the first etching means, so that the portion 83 of the dielectric layer 80 remaining from the etching on floors 62 of the trenches 60 is exposed. This remaining portion 83 of the dielectric layer 80 may then act as the dielectric field plate. Instead of the first etching means, a different, third etching means may also be used for the removal of the remainder of the stop material 90. The first etching means must then only be selectively etching with respect to the stop material 90, and non-etching with respect to the dielectric layer 80.

A gate electrode 50 may then be arranged above the portion 83 of the dielectric field plate.

FIGS. 7, 8, 9, and 10 show exemplary structures of a further exemplary substrate during the production of field plates in trenches of the substrate, and thus schematically illustrate steps and semi-finished products of a further exemplary embodiment of the method provided according to the present disclosure.

Figure 7:
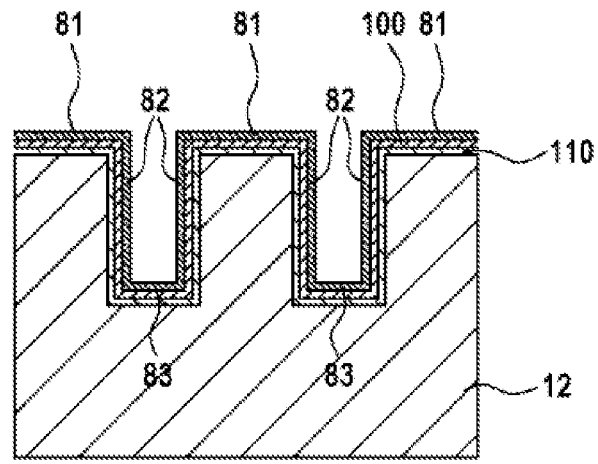
FIG. 7 shows the exemplary substrate from FIG. 1 including a layer stack with an additional dielectric layer on which the dielectric layer is arranged and which is arranged on another, additional dielectric layer.

FIG. 7 shows the further exemplary substrate with a layer stack of two dielectric layers as part of the substrate, which forms walls and floors of the two trenches 60, as well as a surface of the substrate. In this case, the dielectric layer 80 made of a dielectric material is applied in a conformal manner to the layer stack which comprises an additional dielectric layer 100 which is made of an additional dielectric material and which is adjacent to the dielectric layer 80. The layer stack includes at least the one additional dielectric layer 100, wherein the second etching means which etches the dielectric layer 80 does not etch, or only slightly etches, the additional dielectric layer 100. The other, additional dielectric layer 110 of the layer stack, which is separated from the dielectric layer 80 by the additional dielectric layer 100, is optional. If it exists, the other, additional dielectric layer 110 may include the same dielectric (dielectric material) as the dielectric layer 80.

Figure 8:
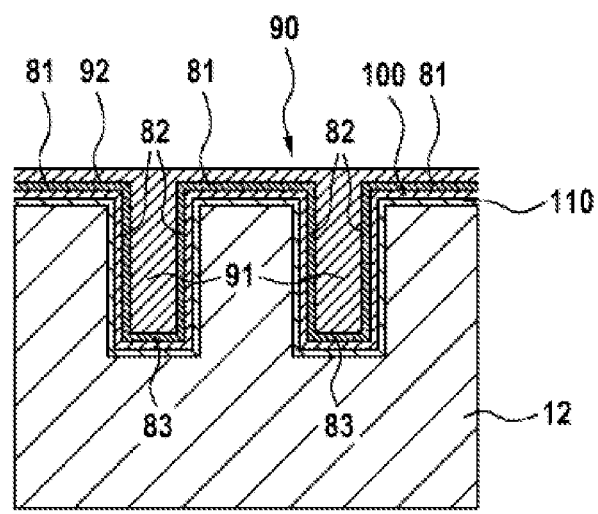
FIG. 8 shows the exemplary substrate from FIG. 7 with a stop material which is deposited onto the dielectric in such a way that the trenches are filled.

FIG. 8 shows the exemplary substrate from FIG. 7 with a stop material 90 which is deposited onto the dielectric view 80 in such a way that the trenches 60 are completely filled. A first portion 91 of the stop material 90 is deposited into the trench 60 in such a way that it is filled. A second portion 92 of the stop material 90 is deposited onto the additional portion 81 of the dielectric layer 80 and onto the filled trench 60.

The stop material differs from the dielectric materials in the sense that, taking into consideration the dielectric materials, the stop material is chosen in such a way that with respect to at least a first etching means, an etching rate of the stop material is greater than an etching rate of the dielectric material and greater than an etching rate of the different dielectric material. Taking into consideration the different dielectric material, the dielectric material is chosen in such a way that with respect to at least one (other) second etching means, an etching rate of the dielectric material is greater than an etching rate of the different material. Exemplary etching rate ratios are 2, 5, 10, and 100.

The stop material 90 may thus be selectively etched via the at least one first etching means, which significantly etches the stop material, but does not at all etch, or only slightly etches, the dielectric layer 80 and the additional dielectric layer 100.

Figure 9:
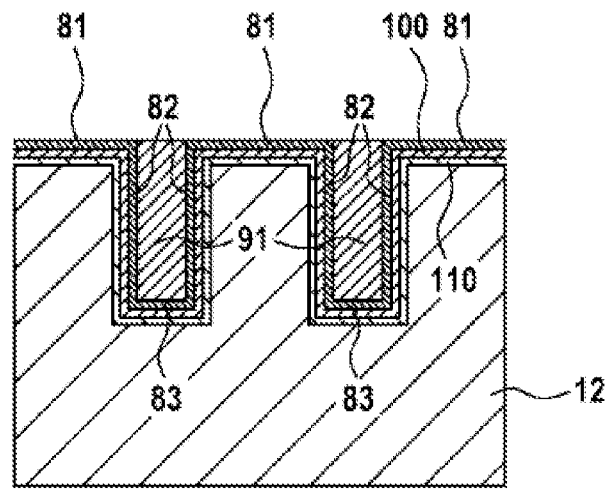
FIG. 9 shows the exemplary substrate from FIG. 8, wherein the stop material is selectively etched back to the extent that the dielectric layer is exposed.

FIG. 9 shows the exemplary substrate from FIG. 8, wherein the stop material 90 has been selectively etched back using the second etching means, so that the portion 81 of the dielectric layer 80 which is arranged above the surface 11 of the substrate 10 is exposed.

Figure 10:
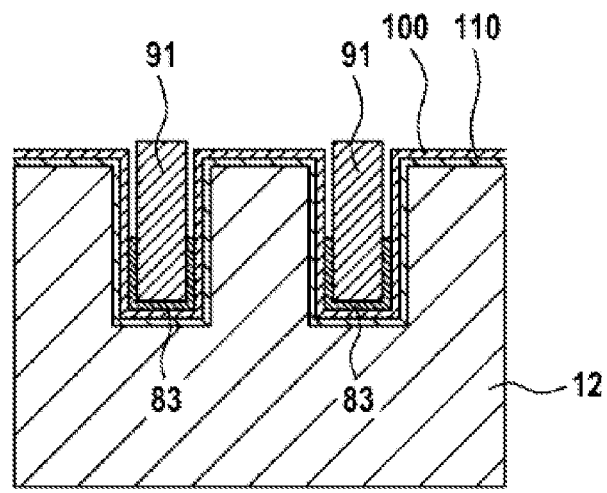
FIG. 10 shows the exemplary substrate from FIG. 9, wherein the dielectric layer is selectively etched back to the extent that the additional dielectric layer is exposed in upper wall sections of the trenches.

FIG. 10 shows the exemplary substrate from FIG. 9, wherein the remainder 82 and the additional portion 81 of the dielectric layer 80 have been selectively etched back using the first etching means, so that the additional dielectric layer 100 in upper sections of the walls 61 of the trenches 60 and above the surface 11 of the substrate 10 is exposed.

Figure 11:
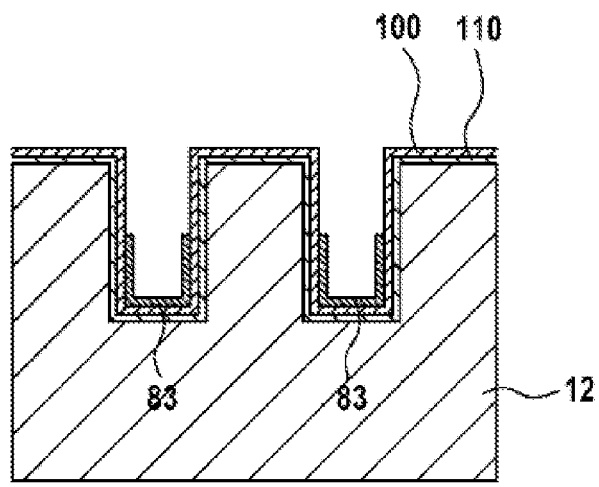
FIG. 11 shows an additional exemplary embodiment of the substrate provided according to the present disclosure, wherein the stop material is completely removed from the trench.

FIG. 11 shows an additional exemplary embodiment of the substrate provided according to the present disclosure. The additional exemplary substrate includes a silicon carbide layer in which a trench 60 is formed, and a dielectric field plate 83 which is arranged in lower sections of the walls of the trench 60 and above a floor of the trench 60 on an additional dielectric layer 100 which is adjacent to the dielectric layer 80, so that an upper layer 100 is not covered by the dielectric field plate in upper sections 61 of the walls. In this case, the additional dielectric layer 100 is arranged on another, additional dielectric layer 110.

The substrate may be produced, for example, by also completely, selectively etching back the first portion 91 of the stop material 90 of the exemplary substrate from FIG. 10 using the other etching means which is selectively etching, so that the portion 83 of the dielectric layer 80 remaining from the etching on floors 62 of the trenches 60 is exposed. This remaining portion 83 of the dielectric layer 80 may then act as the dielectric field plate.

Figure 12:
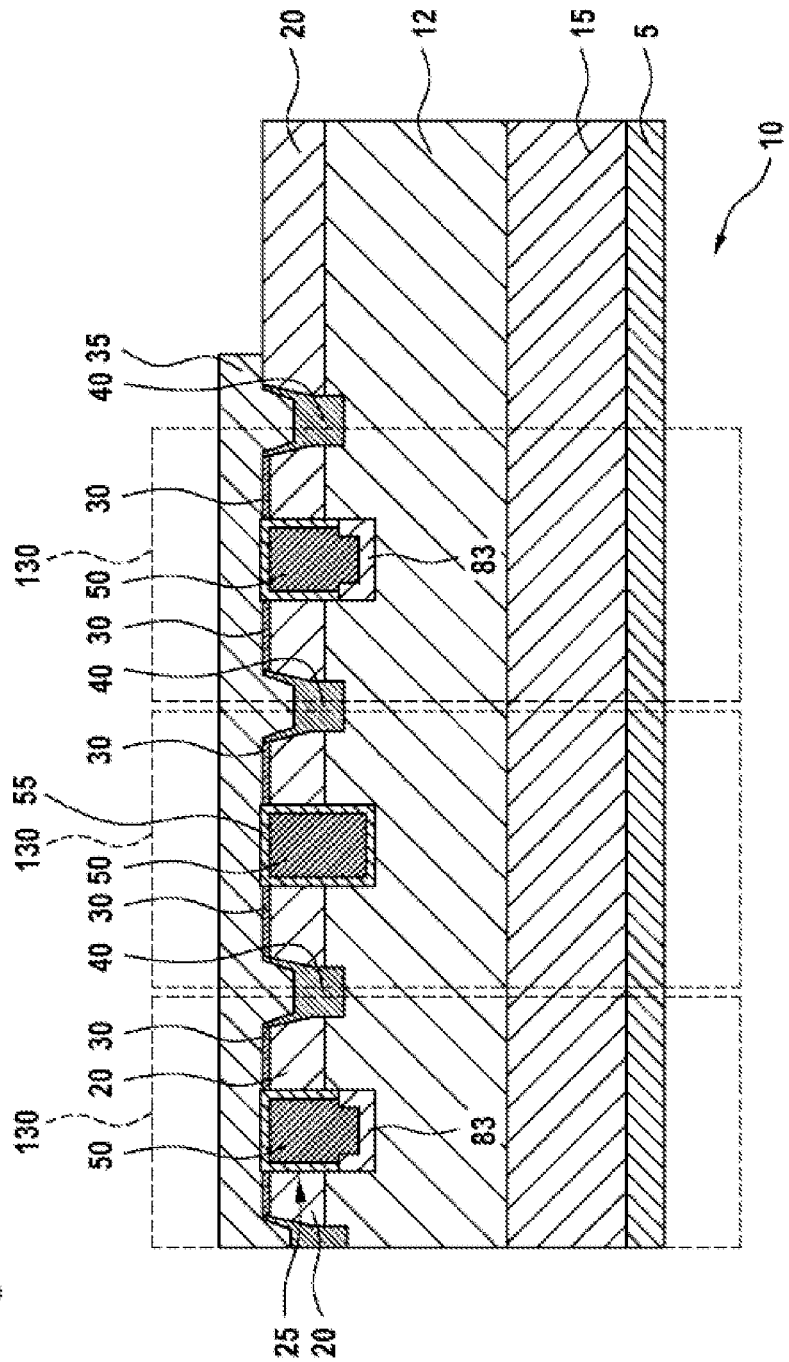
FIG. 12 shows exemplary embodiments of the metal-oxide semiconductor field-effect transistor provided according to the present disclosure.

FIG. 12 shows the section of a metal-oxide semiconductor field-effect transistor, whose gate electrodes 50 are arranged in trenches in the substrate 10, partially above remaining portions 83 of a dielectric layer which act as dielectric field plates 83. The substrate includes a drain electrode 5, a wafer substrate 15 which is arranged on it, an n-doped epitaxial silicon carbide drift zone 12 arranged on the wafer substrate 15, a p-doped silicon carbide layer 20 arranged on the silicon carbide drift zone 12, and an n-doped silicon carbide layer 30 (n$^+$ source). The side walls of the trenches include a portion of the p-doped silicon carbide layer 20 and a portion of the n-doped silicon carbide layer 30. In each of two adjacent trenches, a remaining portion 83 of the dielectric layer is arranged in each case on lower sections of the walls and on the floor as a field plate on a stack of dielectric layers which surround the respective gate electrode 50 in the trench 60, while the field plate surrounds the respective gate electrode only in a region of the trench 60 within the silicon carbide drift zone 12. By means of the gate electrode 50, a vertical channel region 25 is created in the p-doped silicon carbide layer 20. In this case, the p$^+$ plugs 40 are implanted in a recessed manner into the p-doped silicon carbide layer 20 in substrate surface regions between adjacent trenches in such a way that they partially extend into the silicon carbide drift zone 12. A source electrode 35 is connected to the p$^+$ plugs 40. The field plate itself may be formed as a stack of dielectric layers.

The invention claimed is:

1. A method for producing a dielectric field plate in a trench of a substrate, comprising:
    depositing a dielectric structure onto walls and a floor of the trench and onto surface sections of the substrate which are adjacent to the trench, wherein a material or materials of the substrate includes a silicon carbide layer that forms the floor and lower sections of the walls, and wherein a dielectric material or dielectric materials which are included in the dielectric structure differ from the material or materials of the substrate;

depositing a stop material which fills the trench, covers the dielectric structure, and is different from the dielectric material or the dielectric materials, wherein the stop material is also different from a material or materials of the substrate;

selective etching back of a portion of the stop material with a first etching mechanism such that a portion of the dielectric structure which covers the surface sections of the substrate and the walls of the trench is exposed;

selective etching back of the dielectric structure with a second etching mechanism which is different from the first etching mechanism such that the surface of the substrate and upper sections of the walls are exposed, wherein a remainder of the dielectric structure, which covers the floor and the lower sections of the walls, remains; and selective etching back of a remainder of the stop material with a third etching mechanism which is different from the second etching mechanism.

2. The method as claimed in claim 1, wherein the dielectric material is selected from a material group including silicon dioxide, silicon nitride, aluminum oxide, intrinsic polysilicon carbide, and thermally oxidized polysilicon.

3. The method as claimed in claim 1, wherein the stop material is selected from a material group including dielectrics, semiconductors, or metals.

4. The method as claimed in claim 1, wherein the trench and the remainder of the dielectric structure are U-shaped.

5. The method as claimed in claim 1, wherein the first etching mechanism and the third etching mechanism are identical.

6. A substrate, comprising:
a trench including walls and a floor;
a first dielectric layer disposed entirely on the surfaces of the walls and the floor;
a second dielectric layer disposed entirely on the surfaces of the first dielectric layer; and
a dielectric field plate comprising a third dielectric layer that is disposed on the second dielectric layer,
wherein the dielectric field plate abuts only portions of the second dielectric layer corresponding to lower sections of the walls of the trench and the floor of the trench.

7. The substrate as claimed in claim 6, wherein:
the substrate further includes a silicon carbide layer and a p-doped silicon carbide layer which is arranged directly on the silicon carbide layer;
the trench extends through the p-doped silicon carbide layer into the silicon carbide layer; and
the silicon carbide layer defines the floor and lower sections of the walls of the trench.

8. A power transistor, comprising:
a substrate, including:
a trench including walls and a floor;
a first dielectric layer disposed entirely on the surfaces of the walls and the floor;
a second dielectric layer disposed entirely on the surfaces of the first dielectric layer; and
a dielectric field plate comprising a third dielectric layer that is disposed on the second dielectric layer,
wherein the dielectric field plate abuts only portions of the second dielectric layer corresponding to lower sections of the walls of the trench and the floor of the trench; and
a gate electrode disposed on the dielectric field plate.

9. The power transistor as claimed in claim 8, wherein the second dielectric material is selected from the material group including silicon dioxide, silicon nitride, aluminum oxide, intrinsic polysilicon carbide, and thermally oxidized polysilicon.

10. The power transistor as claimed in claim 8, wherein the dielectric field plate surrounds the gate electrode only in a region of the trench within a silicon carbide layer of the substrate.

* * * * *